United States Patent
McCormick

(10) Patent No.: US 9,270,266 B1
(45) Date of Patent: Feb. 23, 2016

(54) HIGH VOLTAGE SWITCHING CIRCUIT

(71) Applicant: LG Chem, Ltd., Seoul (KR)

(72) Inventor: Richard McCormick, Troy, MI (US)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/550,070

(22) Filed: Nov. 21, 2014

(51) Int. Cl.
*H03K 17/687* (2006.01)
*H02M 3/07* (2006.01)

(52) U.S. Cl.
CPC ............... *H03K 17/687* (2013.01); *H02M 3/07* (2013.01)

(58) Field of Classification Search
CPC ..... H03K 3/0231; H03K 3/0315; H03K 5/22; H03K 17/56; H03K 17/102; H03K 17/163; H03K 17/687; H03K 17/6874
USPC .......................... 327/108, 109, 110, 111, 112
See application file for complete search history.

(56) References Cited

U.S. PATENT DOCUMENTS

| | | | |
|---|---|---|---|
| 7,609,554 | B2 | 10/2009 | Tanzawa |
| 8,344,766 | B2 | 1/2013 | Yoshikawa et al. |

*Primary Examiner* — John Poos
(74) *Attorney, Agent, or Firm* — Buckert Patent & Trademark Law Firm, PC; John F. Buckert

(57) ABSTRACT

A high voltage switching circuit includes a low voltage driving circuit having first and second capacitors; and an isolated high voltage driving circuit. The isolated high voltage driving circuit has an isolated charge pump circuit and a transistor driving circuit. The first and second electrical nodes of the isolated charge pump circuit are electrically coupled to the transistor driving circuit, which is coupled to a resistive load. The transistor driving circuit increases an output voltage of the resistive load to a desired output voltage level over a time interval in response to first and second voltage signals being applied to the first and second electrical nodes, respectively, when the first and second capacitors are receiving first and second pulse width modulated voltage signals, respectively, over the time interval.

10 Claims, 3 Drawing Sheets

HIGH VOLTAGE SWITCHING CIRCUIT

BACKGROUND

The inventor herein has recognized a need for an improved high voltage switching circuit.

SUMMARY

A high voltage switching circuit in accordance with an exemplary embodiment is provided. The high voltage switching circuit includes a low voltage driving circuit having first and second capacitors. The high voltage switching circuit further includes an isolated high voltage driving circuit operably coupled to the low voltage driving circuit. The isolated high voltage driving circuit has an isolated charge pump circuit and a transistor driving circuit. The isolated charge pump circuit has first, second, and third diodes, a capacitor, and a first resistor. The first diode is coupled to and between first and second electrical nodes. The second diode is coupled to and between the second electrical node and a third electrical node. The capacitor and the first resistor of the isolated charge pump circuit are electrically coupled in parallel to one another and further coupled to and between the third electrical node and a fourth electrical node. The third diode is coupled to and between the fourth electrical node and the first electrical node. The first capacitor of the low voltage driving circuit is electrically coupled to the second electrical node of the isolated charge pump circuit, and the second capacitor of the low voltage driving circuit is electrically coupled to the first electrical node of the isolated charge pump circuit. The first capacitor is adapted to receive a first pulse width modulated voltage signal. The second capacitor is adapted to receive a second pulse width modulated voltage signal which is 180 degrees out of phase with the first pulse width modulated voltage signal. The third and fourth electrical nodes of the isolated charge pump circuit are electrically coupled to the transistor driving circuit. The transistor driving circuit is further coupled to a resistive load. The transistor driving circuit is adapted to increase an output voltage of the resistive load to a desired output voltage level over a time interval in response to first and second voltage signals being applied to the third and fourth electrical nodes, respectively, when the first and second capacitors are receiving the first and second pulse width modulated voltage signals, respectively, over the time interval.

DETAILED DESCRIPTION

Figure 1:
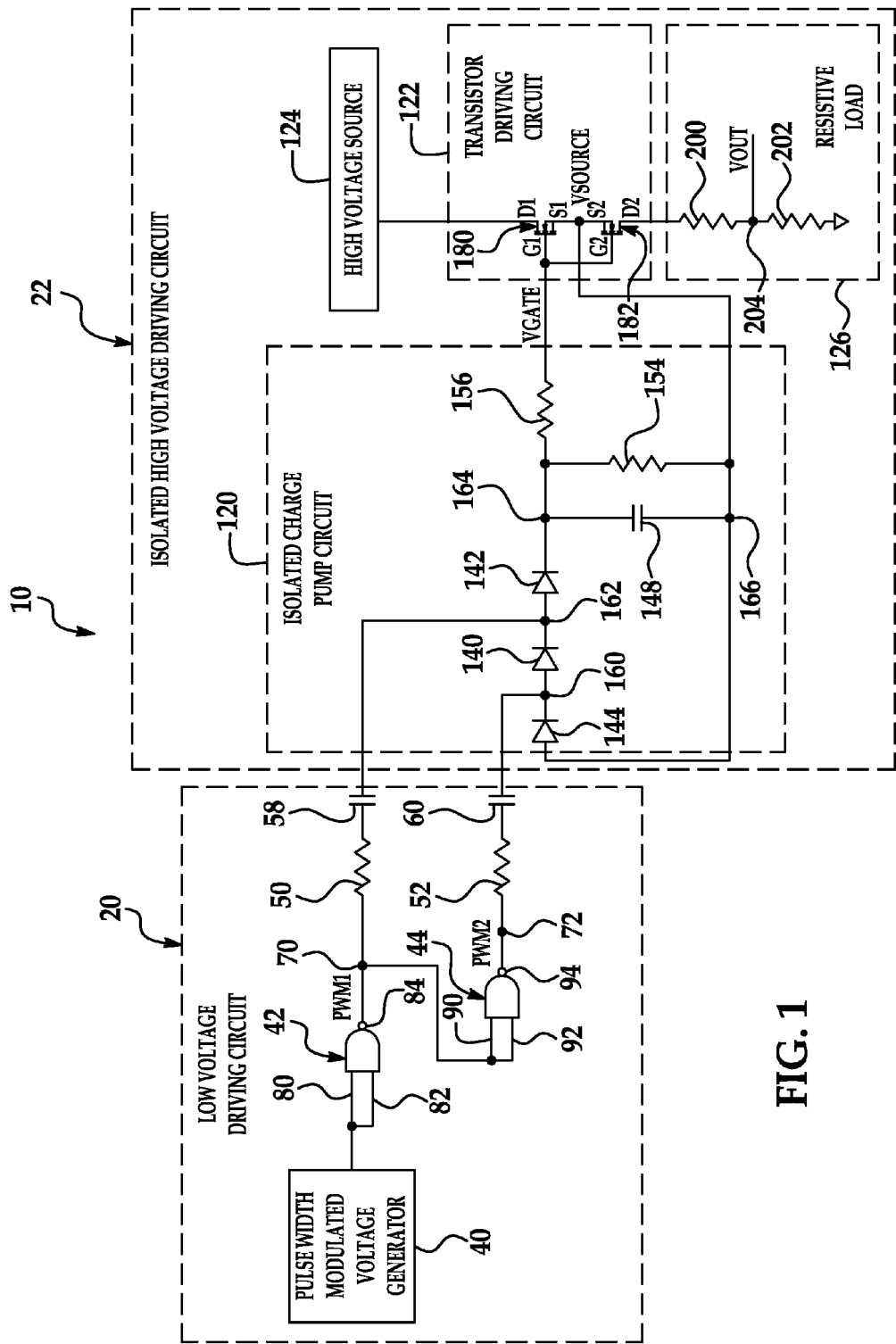
FIG. 1 is a circuit schematic of a high voltage switching circuit having a low voltage driving circuit and an isolated high voltage driving circuit in accordance with an exemplary embodiment.

Referring to FIG. 1, a high voltage switching circuit 10 in accordance with an exemplary embodiment is provided. The high voltage switching circuit 10 includes a low voltage driving circuit 20 and an isolated high voltage driving circuit 22. An advantage of the high voltage switching circuit 10 is that the circuit 10 utilizes capacitors 58, 60 to electrically isolate the low voltage driving circuit 20 from the isolated high voltage driving circuit 22.

The low voltage driving circuit 20 is provided to generate a first pulse width modulated voltage signal PWM1 (shown in FIG. 2) and a second pulse width modulated voltage signal PWM2 (shown in FIG. 3) for driving an isolated charge pump circuit 120 of the isolated high voltage driving circuit 22. In an exemplary embodiment, the second pulse width modulated voltage signal PWM2 is electrically 180° out of phase with the first pulse width modulated voltage signal PWM1. The low voltage driving circuit 20 includes a pulse width modulated voltage generator 40, NAND logic gates 42, 44, resistors 50, 52, capacitors 58, 60, and electrical nodes 70, 72.

The pulse width modulated voltage generator 40 is adapted to generate a pulse width modulated voltage signal is received by the NAND logic gate 42.

Figure 2:
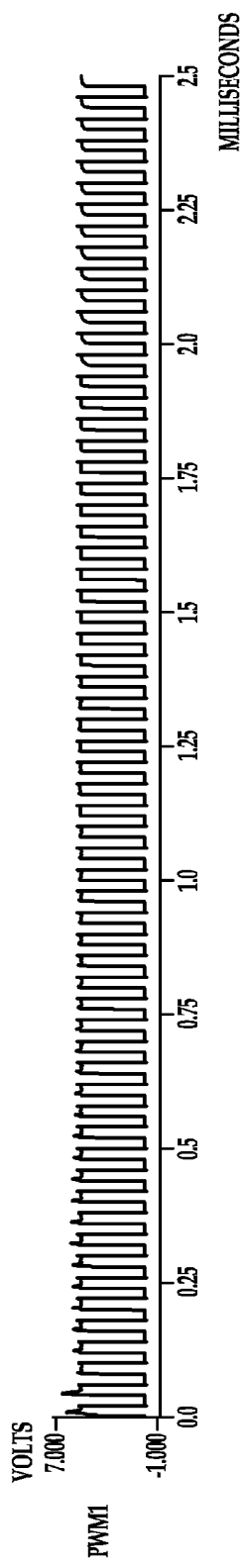
FIG. 2 is a signal schematic of a first pulse width modulated voltage signal PWM1 generated by the low voltage driving circuit of FIG. 1.
Figure 3:
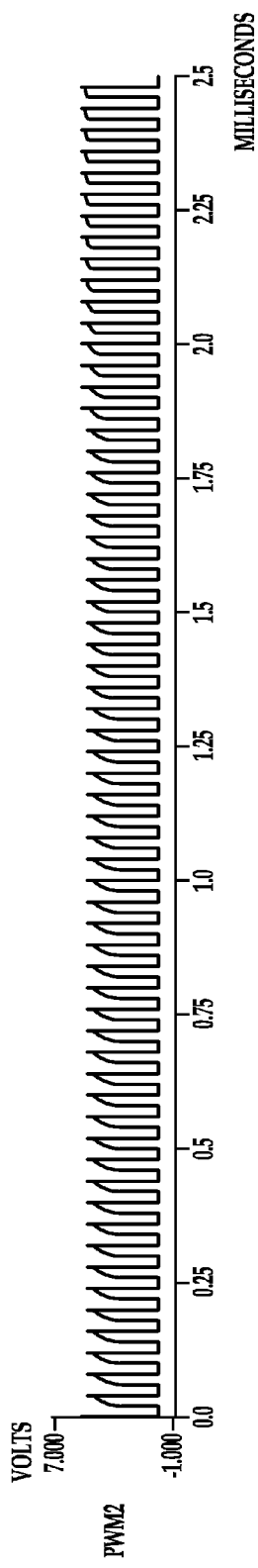
FIG. 3 is a signal schematic of a second pulse width modulated voltage signal PWM2 generated by the low voltage driving circuit of FIG. 1.
Figure 4:
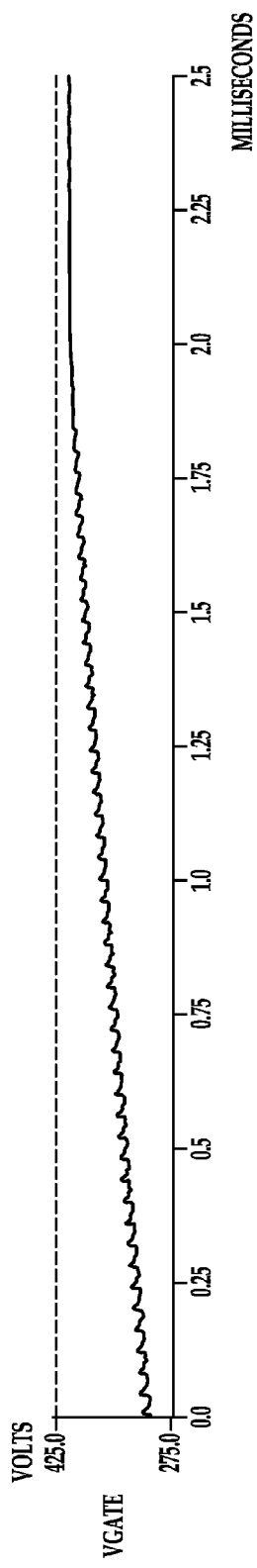
FIG. 4 is a signal schematic of a voltage signal VGATE generated by an isolated charge pump circuit utilized in the isolated high voltage driving circuit of FIG. 1.
Figure 5:
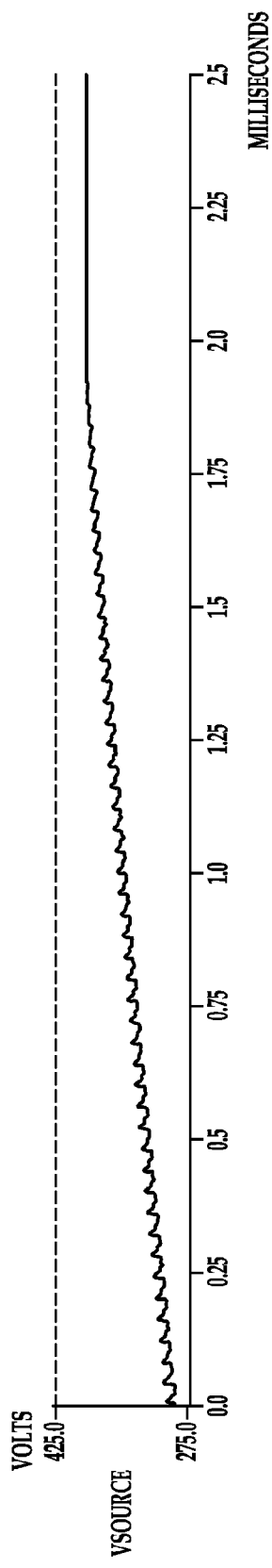
FIG. 5 is a signal schematic of a voltage signal VSOURCE utilized in a transistor driving circuit of the isolated high voltage driving circuit of FIG. 1.
Figure 6:
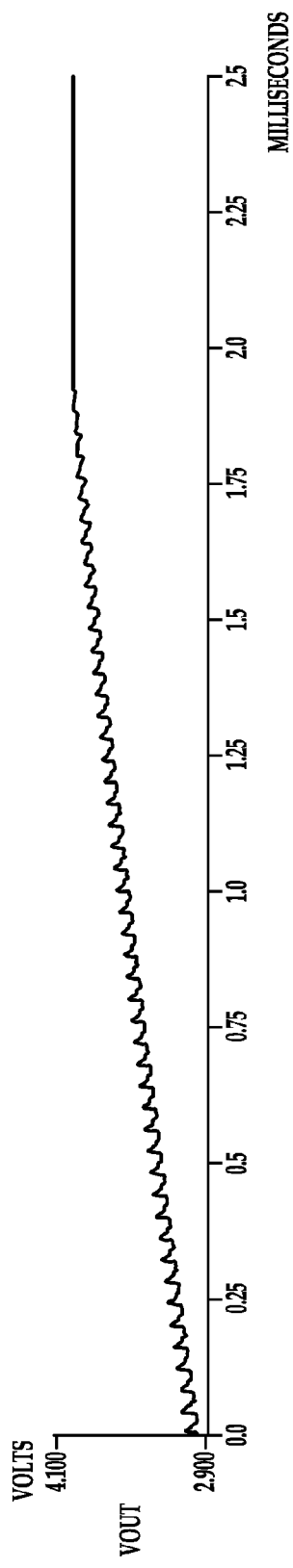
FIG. 6 is a signal schematic of a voltage signal VOUT that is output by a resistive load utilized in the isolated high voltage driving circuit of FIG. 1.

Referring to FIGS. 1-3, the NAND logic gate 40 includes input terminals 80, 82 and an output terminal 84. The input terminals 80, 82 are electrically coupled together and are further coupled to the pulse width modulated voltage generator 40. The output terminal 84 is coupled to the electrical node 70. The resistor 50 is coupled between and to the electrical node 70 and the capacitor 58. The NAND logic gate 40 outputs the first pulse width modulated voltage signal PWM1 at the output terminal 84 in response to a received signal from the pulse width modulated voltage generator 40. In an exemplary embodiment, the first pulse width modulated voltage signal PWM1 has a duty cycle of 50% over a time interval (e.g., 2.5 milliseconds shown in FIG. 2).

The NAND logic gate 44 includes input terminals 90, 92 and an output terminal 94. The input terminals 90, 92 are coupled together and are further coupled to the electrical node 70. The output terminal 94 is coupled to the electrical node 72. The resistor 52 is coupled to and between the electrical node 72 and the capacitor 60. The NAND logic gate 44 outputs the second pulse width modulated voltage signal PWM2 at the output terminal 94 in response to receiving the first pulse width modulated voltage signal PWM1. In an exemplary embodiment, the second pulse width modulated voltage signal PWM2 has a duty cycle of 50% over a time interval (e.g., 2.5 milliseconds shown in FIG. 3).

The isolated high voltage driving circuit 22 is provided to output a high voltage output signal VOUT. The isolated high voltage driving circuit 22 is operably coupled to the low voltage driving circuit 20. The isolated high voltage driving circuit 22 includes an isolated charge pump circuit 120, a transistor driving circuit 122, a high voltage source 124, and a resistive load 126.

The isolated charge pump circuit 120 is adapted to control operation of the transistor driving circuit 122 such that the transistor driving circuit 122 outputs the high voltage output signal VOUT. The isolated charge pump circuit 120 includes diodes 140, 142, 144, a capacitor 148, resistors 154, 156, and electrical nodes 160, 162, 164, 166.

The diode 140 is coupled to and between electrical nodes 160, 162. The diode 142 is coupled to and between the electrical node 162 and the electrical node 164. The capacitor 148 and the resistor 154 are electrically coupled in parallel to one another and further coupled to and between the electrical node 164 and the electrical node 166. The diode 144 is coupled to and between the electrical node 166 and the electrical node 160. The resistor 156 is coupled to and between the electrical node 164 and a gate terminal G1 of the field effect transistor (FET) 180. The resistor 156 is an optional component, and in an alternative embodiment the electrical node 164 is directly coupled to the gate terminal G1 of the FET 180.

The capacitor 58 of the low voltage driving circuit 20 is electrically coupled to the electrical node 162 of the isolated charge pump circuit 120, and the capacitor of the low voltage driving circuit 20 is electrically coupled to the electrical node 160 of the isolated charge pump circuit 120. The capacitor 58 is adapted to receive a pulse width modulated voltage signal PWM1 (shown in FIG. 2) over a time interval (e.g., 0-2.5 milliseconds), and the capacitor 60 is adapted to receive a pulse width modulated voltage signal PWM2 (shown in FIG. 3) over the time interval (e.g., 0-2.5 milliseconds) which is 180 degrees out of phase with the pulse width modulated voltage signal PWM1. The electrical node 164 is electrically coupled through the resistor 156 to the transistor driving circuit 122, and the electrical node 166 is electrically coupled to the transistor driving circuit 122.

Referring to FIGS. 1-6, the transistor driving circuit 122 includes the FET 180 and the FET 182. In an exemplary embodiment, the FETS 180, 182 are each an n-channel FET. The FET 180 includes a gate terminal G1, a source terminal S1, and a drain terminal D1. The FET 182 includes a gate terminal G2, a source terminal S2, and a drain terminal D2. The gate terminal G1 is coupled to the gate terminal G2, the drain terminal D1 is coupled to the high voltage source 124, and the source terminal S1 is coupled to the source terminal S2. The drain terminal D2 is coupled to the resistor 200 of the resistive load 126. The transistor driving circuit 122 is adapted to increase the output voltage VOUT of the resistive load 126 to a desired output voltage level over the time interval in response to the VGATE voltage signal being applied to the gate terminals G1, G2; and the VSOURCE voltage signal being applied to the source terminals S1, S2 and the electrical node 166, when the capacitors 58, 60 are receiving the pulse width modulated voltage signals PWM1, PWM2, respectively, over the time interval. In an exemplary embodiment, the high voltage source 124 output 425 VDC. Of course, in an alternative embodiment, the high voltage source 124 could output other high voltage levels, such as a voltage level in a range of 200 VDC-600 VDC for example.

The isolated charge pump circuit 120 is adapted to increase the VGATE voltage signal over a time interval, that is applied to the gate terminal G1 of the FET 180 such that the VGATE voltage signal is greater than the VSOURCE voltage signal applied to the source terminal S1 of the FET 180 to turn on the FET 180. Further, the VGATE voltage signal is applied to the gate terminal G2 of the FET 182 over the time interval such that the VGATE voltage signal is greater than the VSOURCE voltage signal applied to the source terminal S2 of the FET 182 to turn on the FET 182.

The resistive load 126 includes resistors 200, 202. The resistor 200 is coupled to and between the resistor 202 and the drain terminal D2 of the FET 182. An electrical node 204 is coupled to and between the resistors 200, 202. The resistor 202 is coupled to and between the electrical node 204 and electrical ground such that the output voltage VOUT is applied to the electrical node 204.

The high voltage switching circuit described and claimed herein provides a substantial advantage over other switching circuits. In particular, the high voltage switching circuit utilizes first and second capacitors to electrically isolate a low voltage driving circuit from an isolated high voltage driving circuit.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A high voltage switching circuit, comprising:
   a low voltage driving circuit having first and second capacitors;
   an isolated high voltage driving circuit operably coupled to the low voltage driving circuit; the isolated high voltage driving circuit having an isolated charge pump circuit and a transistor driving circuit;
   the isolated charge pump circuit having first, second, and third diodes, a capacitor, and a first resistor; the first diode being coupled to and between first and second electrical nodes, the second diode being coupled to and between the second electrical node and a third electrical node, the capacitor and the first resistor of the isolated charge pump circuit being electrically coupled in parallel to one another and further coupled to and between the third electrical node and a fourth electrical node; the third diode being coupled to and between the fourth electrical node and the first electrical node;
   the first capacitor of the low voltage driving circuit being electrically coupled to the second electrical node of the isolated charge pump circuit, and the second capacitor of the low voltage driving circuit being electrically coupled to the first electrical node of the isolated charge pump circuit; the first capacitor being adapted to receive a first pulse width modulated voltage signal, the second capacitor being adapted to receive a second pulse width modulated voltage signal which is 180 degrees out of phase with the first pulse width modulated voltage signal;
   the third and fourth electrical nodes of the isolated charge pump circuit being electrically coupled to the transistor driving circuit, the transistor driving circuit being further coupled to a resistive load, the transistor driving circuit being adapted to increase an output voltage of the resistive load to a desired output voltage level over a time interval in response to first and second voltage signals being applied to the third and fourth electrical nodes, respectively, when the first and second capacitors are receiving the first and second pulse width modulated voltage signals, respectively, over the time interval.

2. The high voltage switching circuit of claim 1, wherein the second capacitor being adapted to receive the second pulse width modulated voltage signal which is 180 degrees out of phase with the first pulse width modulated voltage signal such that the second capacitor receives a low logic voltage when the first capacitor simultaneously receives a high logic voltage, and the second capacitor receives the high logic voltage when the first capacitor simultaneously receives the low logic voltage.

3. The high voltage switching circuit of claim 1, wherein the transistor driving circuit includes a first field effect transistor and a second field effect transistor;
- the first field effect transistor having a first gate terminal, a first source terminal, and a first drain terminal;
- the second field effect transistor having a second gate terminal, a second source terminal, and a second drain terminal;
- the first gate terminal adapted to receive the first voltage signal, the first drain terminal being coupled to a high voltage source; the first source terminal being coupled to the second source terminal;
- the second gate terminal being coupled to the first gate terminal, the second drain terminal being coupled to the resistive load.

4. The high voltage switching circuit of claim 3, wherein the isolated charge pump circuit further includes a second resistor coupled to and between the third electrical node and the first gate terminal of the first field effect transistor.

5. The high voltage switching circuit of claim 3, wherein the resistive load includes second and third resistors;
- the second resistor being coupled to and between the third resistor and the second drain terminal of the second field effect transistor; a fifth electrical node being coupled to and between the second and third resistors; and
- the third resistor being coupled to and between the fifth electrical node and electrical ground such that the output voltage is applied to the fifth electrical node.

6. The high voltage switching circuit of claim 3, wherein the first field effect transistor is an n-channel field effect transistor.

7. The high voltage switching circuit of claim 1, wherein the low voltage driving circuit further includes first and second NAND logic gates and second and third resistors;
- the first NAND logic gate having first and second input terminals and a first output terminal; the first and second input terminals of the first NAND logic gate being coupled together and being further coupled to a pulse width modulated voltage generator; the first output terminal of the first NAND logic gate being coupled to a fifth electrical node;
- the second resistor being coupled to and between the fifth electrical node and the first capacitor;
- the second NAND logic gate having first and second input terminals and a first output terminal; the first and second input terminals of the second NAND logic gate being coupled together and being further coupled to the fifth electrical node; the first output terminal of the second NAND logic gate being coupled to a sixth electrical node; and
- the third resistor being coupled to and between the sixth electrical node and the second capacitor.

8. The high voltage switching circuit of claim 1, wherein the first pulse width modulated voltage signal has a duty cycle of 50% over the time interval.

9. The high voltage switching circuit of claim 8, wherein the second pulse width modulated voltage signal has a duty cycle of 50% over the time interval.

10. The high voltage switching circuit of claim 1, wherein an amplitude of the first pulse width modulated voltage signal is less than 10 volts and the desired output voltage level is at least 250 volts.

* * * * *